US009862857B2

(12) United States Patent
Carlborg et al.

(10) Patent No.: US 9,862,857 B2
(45) Date of Patent: *Jan. 9, 2018

(54) METHOD AND FORMULATIONS FOR THE MANUFACTURE OF COATED ARTICLES AND COMPOSITES

(71) Applicant: Mercene Labs AB, Stockholm (SE)

(72) Inventors: Carl Fredrik Carlborg, Stockholm (SE); Tommy Haraldsson, Järfälla (SE)

(73) Assignee: Mercene Labs AB, Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,006

(22) Filed: Sep. 1, 2016

(65) Prior Publication Data
US 2016/0369127 A1 Dec. 22, 2016

Related U.S. Application Data

(63) Continuation of application No. 14/533,129, filed on Nov. 5, 2014, now Pat. No. 9,523,019, which is a continuation of application No. PCT/EP2013/059462, filed on May 7, 2013.

(30) Foreign Application Priority Data

May 7, 2012 (SE) ...................................... 1200269

(51) Int. Cl.
B32B 3/00 (2006.01)
C09D 163/04 (2006.01)
C08F 283/10 (2006.01)
C08G 59/40 (2006.01)
C09D 163/00 (2006.01)
C09D 4/00 (2006.01)
B05D 3/06 (2006.01)
B05D 7/00 (2006.01)
H05K 3/00 (2006.01)
B05D 1/02 (2006.01)
B05D 1/28 (2006.01)
B05D 1/30 (2006.01)
G03F 7/027 (2006.01)
C08F 222/10 (2006.01)
G03F 7/038 (2006.01)

(52) U.S. Cl.
CPC ............. *C09D 163/04* (2013.01); *B05D 1/02* (2013.01); *B05D 1/28* (2013.01); *B05D 1/305* (2013.01); *B05D 3/06* (2013.01); *B05D 3/067* (2013.01); *B05D 7/50* (2013.01); *B05D 7/58* (2013.01); *C08F 283/105* (2013.01); *C08G 59/4064* (2013.01); *C09D 4/00* (2013.01); *C09D 163/00* (2013.01); *H05K 3/0091* (2013.01); *C08F 222/1006* (2013.01); *G03F 7/0275* (2013.01); *G03F 7/038* (2013.01);

*Y10T 428/24851* (2015.01); *Y10T 428/269* (2015.01); *Y10T 428/31515* (2015.04); *Y10T 428/31522* (2015.04)

(58) Field of Classification Search
CPC ...... C09D 163/04; C09D 4/00; C09D 163/00; B05D 1/02; B05D 1/28; B05D 1/306; B05D 3/06; B05D 3/067; B05D 7/50; B05D 7/58; C08F 283/105; H05K 3/0091; Y10T 428/24851; Y10T 428/269; Y10T 428/31515; Y10T 428/31522
See application file for complete search history.

(56) References Cited

U.S. PATENT DOCUMENTS 4,435,497 A 3/1984 Irving
2003/0228424 A1 12/2003 Dove
2010/0203429 A1 8/2010 Tomari et al.

FOREIGN PATENT DOCUMENTS

DE 34 36 571 6/1985
GB 2 012 781 8/1979
RU 2 311 968 C2 12/2007
WO 2012/042059 4/2012

OTHER PUBLICATIONS

Office Action received in corresponding Russian Application No. 2014144126/04 dated Mar. 24, 2017.
Database Caplus [Online], Chemical Abstracts Service, Columbus,Ohio, US, Jul. 28, 2010, Apr. 7, 2010 Sangermano, Marco et al "Preparation and characterization of hybrid thiol-ene/epoxy UV-thermal dual-cured systems".
Fredrik Forsberg et al: "Low temperature adhesive wafer bonding using OSTE(+) for heterogeneous 3D MEMS integration", Micro Electr0 Mechanical Systems (MEMS), 2013 IEEE 26th International C0nferenceOn, IEEE, Jan. 20, 2013.
Database Caplus [Online], Chemical Abstracts Service, Columbus, Ohio, US, Mar. 5, 2007, Jan. 25, 2007, Carioscia, Jacqueyn A. et al, "Evaluation and control of thiol-ene/thiol-epoxy-hybrid networks".

Primary Examiner — Elizabeth E Mulvaney
(74) Attorney, Agent, or Firm — Renner, Otto, Boisselle & Sklar, LLP

(57) ABSTRACT

An object with a coating comprising: a) covalent bonds formed by reaction of a thiol group and a carbon-carbon double bond, b) covalent bonds formed by reaction of a thiol group and epoxide group, c) covalent bonds formed by a reaction of a carbon-carbon double bond and an epoxide group, said coating comprising a first primer coating and a second coating, said coating comprising covalent bonds between said first and second coatings, said first primer coating comprising covalent cross links between compounds, in the first coating the fraction (r3=ta/tc) of unreacted thiol groups (ta) to thiol groups which have reacted to form a covalent bond (tc) does not exceed 0.11, wherein the half height peak width of tan delta does not exceed 30° C. Advantages of the dual cure composition is that excellent strength is obtained and that the second curing is slow compared to the first initial curing.

17 Claims, No Drawings

METHOD AND FORMULATIONS FOR THE MANUFACTURE OF COATED ARTICLES AND COMPOSITES

This application is a continuation of U.S. application Ser. No. 14/533,129, filed Nov. 5, 2014, which is a continuation of PCT Application No. PCT/EP2013/059462, filed May 7, 2013, which claims priority of SE 1200269-7, filed May 7, 2012, the entire contents of each of which are hereby incorporated by reference.

BACKGROUND

The present invention relates to the field of coating technology, in particular a primer coating for the use with polymeric coating systems for materials including but not limited to wood, metals, rubber, thermoplastics, paper and textiles, where the primer retains reactivity for a period of time after a first curing process is completed.

State of the art processes for fabricating multilayer coatings use actinic radiation in combination with photocurable prepolymer compositions that contain reactive monomers and oligomers, fillers and additives such as leveling agents to rapidly achieve highly cross linked polymer coatings. Typically, multilayer coatings are composed of thin layers that are applied in the wet state and cured sequentially. To ensure good adhesion between the wood or metal and the multilayer coating, a primer is usually employed. In the case of wood, this primer is sometimes waterborne to ensure good adhesion to the wood, and for metal, the primer layer is often a silane compound, where one end of the molecule covalently bonds to the metal substrate and the other end of the molecule covalently links with the first coatings layer.

To ensure adhesion between layers, state of the art processes utilize a controlled level of oxygen inhibition to ensure that reactive compounds remain to covalently bond to the next applied layer upon additional cure.

In the art, off stoichiometry has long been well known and one patent describing thiol-ene polymers (U.S. Pat. No. 3,697,396) claims significantly off-stoichiometric mixtures, 0.5/1 to 2/1 ene to thiol ratio, and gives examples of materials fabricated via significant off stoichiometry and reports curing time and shore hardness of said materials. Single shaped molded cast articles from thiol-enes are claimed, while micropatterning and assembly of articles from separately fabricated thiol-ene pieces are not mentioned.

Off stoichiometric formulations have been previously described in the art. In a work by Khire et al. (Adv. Mater. 2008, 20, 3308-3313), very thin nanopatterned off stoichiometry thiol-ene films were fabricated using a nanopatterned PDMS stamp. The prepolymer contained a small excess of thiols and the thiol groups present on the polymer surface after the polymerization was utilized for subsequent surface modification via a grafting-to process. Off stoichiometry was also used to control the thickness of the grafted layer where, by adjusting the thiol to ene ratio, oligomers of a predetermined average size where polymerized in bulk and attached to the thiol excess polymer surface. While off stoichiometric formulations have been known in the art and sometimes are used, no systematic investigation into the properties of off-stoichiometric formulations have been performed. On the contrary, it is often argued that off-stoichiometry results in very poor mechanical properties, and should be avoided, (Belfield et al. ACS symposium series 2003, p 65). The reasons for this are twofold: firstly deviation from stoichiometry results in a non-optimized polymeric network with less than the maximum number of crosslinks and the inclusion of dangling chain ends; and secondly, there is a finite risk that monomers are left unreacted in the network, thus risking leaching into the environment.

Ternary prepolymer formulations have been previously described in the art. Carioscia et al. (J. A. Carioscia et al., Polymer 48, (2007) 1526-1532) described the cure kinetics and Tg of a ternary prepolymer formulation consisting of a thiol an allyl and an epoxide monomer. In the mixture there was also added a radical initiator and anionic initiator. While good ultimate mechanical properties were achieved, no attempt to temporally separate the dual cure events to utilize the inherent reactivity after an initial cure was attempted nor was such a strategy suggested.

U.S. Pat. No. 5,821,305 discloses a cross linked epoxy resin, where the epoxy has been cross linked with a carboxylic anhydride, where the anhydride is a copolymer of an ethylenically unsaturated anhydride and a vinyl compound. Triallylcyanurate is present.

U.S. Pat. No. 4,755,571 discloses a curable composition comprising an acrylic ester, an epoxide resin and a curing agent which can be a polymercaptan. The compositions can be used as adhesives and for fixing surfaces together.

For micropatterning of polymers, commercial as well as in-house thiol-ene formulations using both molding and direct photolithography have been described in the art. In (D. Bartolo, et al, *Lab Chip*, 2008, 8, 274) a method utilizing NOA 81, a commercially available thiol-ene based UV-curable glue, was shown to result in microfluidic devices, with adequate mechanical and bulk materials properties. Also good bonding to a substrate was shown upon renewed polymerization of an oxygen inhibited uncured polymer layer situated on the bottom of the device. Furthermore, it was claimed that oxygen inhibition, due to the high gas permeability of the PDMS mold, was effective for creating a layer of unreacted prepolymer on the channel surfaces, which is useful for subsequent surface modifications. In another example (J. Ashley et al. Lab Chip, 2011, 11, 2772-2778), a freeform UV-curable photolithographic technology using thiol-enes was shown. Uniquely, the propensity for unwanted cure in shadow regions exhibited by thiol-enes, due to the high mobility of radicals and low propensity for inhibition, was hindered by a large amount of inhibitor added to the mixture.

WO 2012/042059 discloses a method of manufacturing articles comprising reacting a compound comprising at least two thiol groups and a compound comprising at least two carbon-carbon double bonds in off stoichiometry ratios to obtain an intermediate article. That intermediate article comprises at least one unreacted group selected from an unreacted thiol group and an unreacted carbon-carbon double bond, and is subsequently contacted with a second article, wherein the surface of the second article comprises reactive groups. Subsequently the unreacted groups on the intermediate article are reacted with chemical groups on the second article to obtain covalent bonds and forming a final article. The first and/or the second article may also comprise at least one epoxide group.

SUMMARY

It is an object of the present invention to obviate at least some of the disadvantages in the prior art and provide an improved coating as well as an improved method.

In a first aspect there is provided a method for at least partially coating an object, said method comprising the steps: a) applying at least partially to said object at least one of the following: A i. a compound comprising at least two thiol groups, ii a compound comprising at least two carbon-carbon double bonds, and iii a compound comprising at least two epoxide groups, and B I a compound comprising at least two thiol groups, ii a compound comprising at least one carbon-carbon double bond and at least one epoxide group, wherein ratio (r1=t/cc) of the total number of thiol groups (t) in all of the above compounds and the total number of carbon-carbon double bonds (cc) in all of the above compounds is selected from the group consisting of $0.1 \leq r1 \leq 0.9$ and $1.1 \leq r1 \leq 20$, with the proviso that if the ratio r1 is in the interval: $0.1 \leq r1 \leq 0.9$, then at least one homopolymerizing ene-compound is used, wherein ratio (r2=t/e) of the total number of thiol groups (t) in all of the above compounds and the total number of epoxide groups (e) in all of the above compounds is in the range $0.3 \leq r2 \leq 20$, b) initiating a reaction of at least a part of the applied compound comprising at least two thiol groups with at least one of i at least a part of the applied compound comprising at least two carbon-carbon double bonds and, ii at least a part of the applied compound comprising at least two epoxide groups, iii at least a part of the applied compound comprising at least one carbon-carbon double bond and at least one epoxide group, to obtain an intermediate at least partial coating, wherein said coating comprises at least one compound comprising an unreacted group selected from the group consisting of an unreacted thiol group, and an unreacted epoxide group, c initiating a reaction of at least a part of said at least one compound comprising an unreacted group, wherein at least one further coating is applied at least one point selected from the group consisting of after step b) and after step c), to obtain to a final coated article.

In a second aspect there is provided a coated object comprising a coating which are at least partially applied to said object, said coating comprising: a) covalent bonds formed by reaction of a thiol group and a carbon-carbon double bond, b) covalent bonds formed by reaction of a thiol group and epoxide group, c) covalent bonds formed by a reaction of a carbon-carbon double bond and an epoxide group, said coating comprising a first coating and a second coating, said coating comprising covalent bonds between said first and second coatings, said first coating comprising covalent cross links between compounds, in the first coating the fraction (r3=ta/tc) of unreacted thiol groups (ta) to thiol groups which have reacted to form a covalent bond (tc) does not exceed 0.11, wherein, for the first coating the half height peak width of tan delta does not exceed 30° C., said tan delta peak temperature (Tp) (Tp=Tg) and said half height peak width being obtained from a viscoelasticity (tan delta) temperature distribution curve which is determined using a viscoelastic spectrometer at a frequency of 1 Hz, an initial strain of 0.1%, an amplitude of 15 µm and a temperature elevating rate of 5° C./min, temperatures being equal to and greater than Tp to the temperature defined by the point of intersection of the line of tan delta=½P, wherein P is the peak value of tan δ, with the distribution curve.

Further aspects and embodiments are defined in the appended claims, which are specifically incorporated herein by reference.

One advantage is that the first applied coating (primer) retains reactivity for a period of time after a first curing process is completed.

Another advantage is that excellent adhesion strength is achieved due to covalent bonding.

Yet another advantage is that excellent mechanical properties as compared with off stoichiometry or stoichiometry thiol-enes with higher ultimate Tg and higher Young's modulus are obtainable due to a large number of hydrogen bonds and very high crosslink densities.

The primer coatings have very low residual stress compared with state of the art coatings, which results in more durable coatings.

Another advantage is that there are very little leachable monomers (compared with off stoichiometry thiol-enes, acrylates and methacrylates) due to very high conversion of functional groups.

It is possible to obtain excellent barrier properties due to very high crosslink densities.

Due to the dual curing there is reduced stress in subsequent coatings due to a rubbery modulus after the first cure (allows for the subsequent coating to "glide" on top of the primer coating after the first cure).

Narrow Tan delta peaks extends the usage temperature range to very close to Tg.

Tunable ultimate Tg and Young's modulus allows for optimized primer formulations with respect to the substrate's Young's modulus.

High strain until break, as compared with standard acrylate formulations, allows for primers that withstand small deformations without cracking.

The possibility to obtain excellent optical clarity allows for primers on transparent or white substrates without or with minimal discoloration.

Less oxygen inhibition compared to acrylates and methacrylates allows for very thin primer layers without detrimental effects due to partial inhibition of polymerization by oxygen.

Less moisture sensitivity compared with cationically curing systems allows for even coatings quality under varying ambient conditions.

Highly compatible with many types of filler particles due to covalent linkages between the polymer matrix and the particles due to the complementary reactivity of thiols and anionically cured epoxies.

DETAILED DESCRIPTION

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

The term "about" as used in connection with a numerical value throughout the description and the claims denotes an interval of accuracy, familiar and acceptable to a person skilled in the art. Said interval is ±10%.

In a first aspect there is provided a method for at least partially coating an object, said method comprising the steps:

a) applying at least partially to said object at least one of the following:

A
  i. a compound comprising at least two thiol groups,
  ii. a compound comprising at least two carbon-carbon double bonds, and
  iii. a compound comprising at least two epoxide groups, and B
  i. a compound comprising at least two thiol groups,
  ii. a compound comprising at least one carbon-carbon double bond and at least one epoxide group, wherein ratio ($r_1=t/cc$) of the total number of thiol groups (t) in all of the above compounds and the total number of carbon-carbon double bonds (cc) in all of the above compounds is selected from the group consisting of $0.1 \leq r_1 \leq 0.9$ and $1.1 \leq r_1 \leq 20$, with the proviso that if the ratio $r_1$ is in the interval: $0.1 \leq r_1 \leq 0.9$, then at least one homopolymerizing ene-compound is used, wherein ratio ($r_2=t/e$) of the total number of thiol groups (t) in all of the above compounds and the total number of epoxide groups (e) in all of the above compounds is in the range $0.3 \leq r_2 \leq 20$, b) initiating a reaction of at least a part of the applied compound comprising at least two thiol groups with at least one of
  i. at least a part of the applied compound comprising at least two carbon-carbon double bonds and,
  ii. at least a part of the applied compound comprising at least two epoxide groups,
  iii. at least a part of the applied compound comprising at least one carbon-carbon double bond and at least one epoxide group, to obtain an intermediate at least partial coating, wherein said coating comprises at least one compound comprising an unreacted group selected from the group consisting of an unreacted thiol group, and an unreacted epoxide group, c) initiating a reaction of at least a part of said at least one compound comprising an unreacted group, wherein at least one further coating is applied at least one point selected from the group consisting of after step b) and after step c), to obtain to a final coated article.

In one embodiment the reaction between at least a part of the applied compound comprising at least two thiol groups and at least a part of the applied compound comprising at least one or two carbon-carbon double bonds is initiated with at least one selected from the group consisting of actinic radiation, and elevated temperature. In one embodiment the reaction of the at least one compound comprising an unreacted group selected from the group consisting of an unreacted thiol group and an unreacted epoxide group is initiated with at least one selected from the group consisting of actinic radiation, and elevated temperature. In one embodiment the reaction of the at least one compound comprising an unreacted group selected from the group consisting of an unreacted thiol group and an unreacted epoxide group is mediated with a basic compound.

In one embodiment step b) and c) are initiated simultaneously. Alternatively step b is initiated first and step c is initiated afterwards. In yet another embodiment step c is initiated first and subsequently step b is initiated. The reaction initiated in step b is relatively quick and the reaction initated in step c is relatively slow. In this respect quick and slow relates to the other reaction, i.e. the reaction in step b is quicker than the reaction in step c. The time for the reaction is measured until no further reactions occur. When both the reaction in step b) and the reaction in step c) have completed, more than 90% of the thiol groups have reacted to form covalent bonds. Often more than 95% of the thiol groups or even more than 99% of the thiol groups form covalent bonds.

In one embodiment the at least one further coating comprises at least one compound selected from the group consisting of a compound reactive with a thiol forming a covalent bond and a compound reactive with an epoxide to form a covalent bond. In one embodiment the at least one further coating comprises at least one compound comprising at least one chemical group selected from the group consisting of a hydroxyl group, an amine group, a thiol group, an anhydride group, a cyanoacrylate group, an epoxide group, and a metal oxide. In one embodiment the at least one further coating comprises at least one compound comprising a chemical group selected from the group consisting of an acrylate, a methacrylate, a thiol, an isocyanate, a maleate, a fumarate, a vinyl ether, an alkene, an alkyne, an allyl ether. In one embodiment the at least one further coating comprises at least one selected from the group consisting of a metal, a polymer sheet, and a powder.

In one embodiment the surface of said object to be at least partially coated comprises at least one selected from the group consisting of a metal, a rubber, silicon, a thermoplastic elastomer, cellulose fibers, a textile, wood, a composite material, concrete, and stone.

In one embodiment the object to be at least partially coated is a printed circuit board.

In one embodiment the compound comprising at least two thiol groups is selected from the group consisting of pentaerythritol tetrakis(2-mercaptoacetate), pentaerythritol tetramercaptopropionate (PETMP); 1-octanethiol; butyl 3-mercaptopropionate; 2,4,6-trioxo-1,3,5-triazina-triy (triethyl-tris(3-mercapto propionate); 1,6-Hexanedithiol; 2,5-dimercaptomethyl-1,4-dithiane, pentaerythritol tetramercaptoacetate, trimethylolpropane trimercaptoacetate, 2,3-dimercapto-1-propanol, 2,3-(dimercaptoethylthio)-1-mercaptopropane, 1,2,3-trimercaptopropane, toluenedithiol, xylylenedithiol, 1,8-octanedithiol, and trimethylolpropane tris(3-mercaptopropionate), and glycol dimercaptopropionate and pentaerythritol tetramercaptopropionate (PETMP)

In one embodiment the compound comprising at least two carbon-carbon double bonds is selected from the group consisting of triallyl-1,3,5-triazine-2,4,6(1H,3H,5H)-trione; triethyleneglycol divinyl ether (TEGDVE); trimethylolpropane diallyl ether; 1,6-heptadiyne; 1,7-octadiyne; bis-2,2-[4-(2-[norborn-2-ene-5-carboxylate]ethoxy)phenyl]propane (BPAEDN); 1,6-hexanediol di-(endo,exo-norborn-2-ene-5-carboxylate) (HDDN); trimethylolpropane tri-(norborn-2-ene-5-carboxylate) (TMPTN); pentaerythritoltri-(norborn-2-ene-5-carboxylate) (PTN3); pentaerythritol tetra-(norborn-2-ene-5-carboxylate) (PTN4); tricyclodecane dimethanol di-(endo, exo-norborn-2-ene-5-carboxylate) (TCDMDN); and di(trimethylolpropane) tetra-(norborn-2-ene-5-carboxylate) (DTMPTN).

In one embodiment the compound comprising at least two epoxide groups is selected from the group consisting of Tris(2,3-epoxidepropyl) isocyanurate, trimethylolpropane triglycidyl ether, tris(4-hydroxyphenyl)methane triglycidyl ether, poly(ethylene glycol) diglycidyl ether, bisphenol A diglycidyl ether 1,2,5,6-diepoxidecyclooctane, 1,2,7,8-diepoxideoctane, 1,2-Epoxide-5-hexene, 1,4-cyclohexanedimethanol diglycidyl ether, 3,4-epoxidecyclohexylmethyl 3,4- epoxidecyclohexanecarboxylate, 4,4'-methylenebis(N,N-diglycidylaniline), bis[4-(glycidyloxy)phenyl]methane, bis[4-(glycidyloxy)phenyl]methane, diglycidyl 1,2-cyclohexanedicarboxylate, N,N-diglycidyl-4-glycidyloxyaniline, neopentyl glycol diglycidyl ether, resorcinol diglycidyl ether, and tris(4-hydroxyphenyl)methane triglycidyl ether.

In one embodiment the compound comprising at least two epoxide groups is allylglycidylether.

In one embodiment compounds mentioned under A are used, i.e. i) a compound comprising at least two thiol groups, ii) a compound comprising at least two carbon-carbon double bonds, and iii) a compound comprising at least two epoxide groups. In an alternative embodiment compounds mentioned under B are used, i.e. i) a compound comprising at least two thiol groups, and ii) a compound comprising at least one carbon-carbon double bond and at least one epoxide group. In yet another embodiment compounds mentioned under both A and B are used.

In one embodiment the thickness of the compounds added in step a is in the interval 2-100 µm. If the compounds are added partially the thickness is measured only for the parts where compounds are added. Areas of the object which are not coated are not used for the calculation of the thickness. The thickness is calculated as an average thickness for the areas where the compounds are applied.

In a second aspect there is provided a coated object comprising a coating which are at least partially applied to said object, said coating comprising: a) covalent bonds formed by reaction of a thiol group and a carbon-carbon double bond, b) covalent bonds formed by reaction of a thiol group and epoxide group, c) covalent bonds formed by a reaction of a carbon-carbon double bond and an epoxide group,
said coating comprising a first coating and a second coating, said coating comprising covalent bonds between said first and second coatings,
said first coating comprising covalent cross links between compounds, in the first coating the fraction ($r_3$=ta/tc) of unreacted thiol groups (ta) to thiol groups which have reacted to form a covalent bond (tc) does not exceed 0.11, wherein for the first coating the half height peak width of tan delta does not exceed 30° C., said tan delta peak temperature (Tp) and said half height peak width being obtained from a viscoelasticity (tan delta) temperature distribution curve which is determined using a viscoelastic spectrometer at a frequency of 1 Hz, an initial strain of 0.1° A, an amplitude of 15 µm and a temperature elevating rate of 5 deg C./min, temperatures being equal to and greater than Tp to the temperature defined by the point of intersection of the line of tan delta=½P, wherein P is the peak value of tan δ, with the distribution curve.

There is a standard for determination of the half height peak width of tan tan delta: ASTM 1640. The above described method deviates slightly regarding the temperature change.

In one embodiment of the second aspect the second coating comprises at least one compound comprising at least one chemical group selected from the group consisting of a hydroxyl group, an amine group, a thiol group, an anhydride group, a cyanoacrylate group, an epoxide group, and a metal oxide. In one embodiment of the second aspect the second coating comprises at least one compound comprising a chemical group selected from the group consisting of an acrylate, a methacrylate, a thiol, an isocyanate, a maleate, a fumarate, a vinyl ether, an alkene, an alkyne, an allyl ether. In one embodiment of the second aspect the second coating comprises at least one selected from the group consisting of a metal, a polymer sheet, and a powder.

In one embodiment of the second aspect the surface of the object comprises at least one selected from the group consisting of a metal, a rubber, silicon, a thermoplastic elastomer, cellulose fibers, a textile, wood, a composite material, concrete, and stone.

In one embodiment of the second aspect the at least partially coated object is a printed circuit board.

In one embodiment of the second aspect the first coating comprises at least one compound selected from the group consisting of pentaerythritol tetrakis(2-mercaptoacetate), pentaerythritol tetramercaptopropionate (PETMP); 1-octanethiol; butyl 3-mercaptopropionate; 2,4,6-trioxo-1,3,5-triazina-triy (triethyl-tris(3-mercapto propionate); 1,6-Hexanedithiol; 2,5-dimercaptomethyl-1,4-dithiane, pentaerythritol tetramercaptoacetate, trimethylolpropane trimercaptoacetate, 2,3-dimercapto-1-propanol, 2,3-(dimercaptoethylthio)-1-mercaptopropane, 1,2,3-trimercaptopropane, toluenedithiol, xylylenedithiol, 1,8-octanedithiol, and trimethylolpropane tris(3-mercaptopropionate), and glycol dimercaptopropionate and pentaerythritol tetramercaptopropionate (PETMP), wherein at least one thiol group has formed a covalent bond with at least one selected from a carbon-carbon double bond and an epoxide group.

In one embodiment of the second aspect the first coating comprises at least one compound selected from the group consisting of triallyl-1,3,5-triazine-2,4,6(1H,3H,5H)-trione; triethyleneglycol divinyl ether (TEGDVE); trimethylolpropane diallyl ether; 1,6-heptadiyne; 1,7-octadiyne; bis-2,2-[4-(2-[norborn-2-ene-5-carboxylate]ethoxy)phenyl]propane (BPAEDN); 1,6-hexanediol di-(endo,exo-norborn-2-ene-5-carboxylate) (HDDN); trimethylolpropane tri-(norborn-2-ene-5-carboxylate) (TMPTN); pentaerythritoltri-(norborn-2-ene-5-carboxylate) (PTN3); pentaerythritol tetra-(norborn-2-ene-5-carboxylate) (PTN4); tricyclodecane dimethanol di-(endo, exo-norborn-2-ene-5-carboxylate) (TCDMDN); and di(trimethylolpropane) tetra-(norborn-2-ene-5-carboxylate) (DTMPTN), wherein at least one carbon-carbon double bond has formed a covalent bond with at least one selected from a thiol group and an epoxide group.

In one embodiment of the second aspect the first coating comprises at least one compound selected from the group consisting of Tris(2,3-epoxidepropyl) isocyanurate, trimethylolpropane triglycidyl ether, tris(4-hydroxyphenyl)methane triglycidyl ether, poly(ethylene glycol) diglycidyl ether, bisphenol A diglycidyl ether 1,2,5,6-diepoxidecyclooctane, 1,2,7,8-diepoxideoctane, 1,2-Epoxide-5-hexene, 1,4-cyclohexanedimethanol diglycidyl ether, 3,4-epoxidecyclohexylmethyl 3,4-epoxidecyclohexanecarboxylate, 4,4'-methylenebis(N,N-diglycidylaniline), bis[4-(glycidyloxy)phenyl]methane, bis[4-(glycidyloxy)phenyl]methane, diglycidyl 1,2-cyclohexanedicarboxylate, N,N-diglycidyl-4-glycidyloxyaniline, neopentyl glycol diglycidyl ether, resorcinol diglycidyl ether, and tris(4-hydroxyphenyl)methane triglycidyl ether, wherein at least one epoxide group has formed a covalent bond with at least one selected from a thiol group and a carbon-carbon double bond.

In one embodiment of the second aspect the thickness of the coating is in the interval 0.01-2000 µm. The thickness of the coating is the total thickness of the first coating (the primer) and the second coating. The thickness of the first coating is in one embodiment in the interval 0.005-500 µm. The thickness of the second coating is in one embodiment in the interval 0.005-1500 µm. The thickness of the coatings mentioned in this paragraph refer to the thickness after the curing reactions have completed.

The invention provides the means for formulating and using coatings systems that comprise a primer (first coating) and a further coating (second coating) applied to various materials. The individual coating layers that form a final multilayer coating comprise, for at least one of the coatings layers, chemical compounds that provide dual cure capability, i.e. a system where a first reaction provides intermediate mechanical and chemical properties and a second cure that provides final mechanical and chemical properties. In this manner, a solid or semi-solid coating with multitude reactive groups is present after a first, rapid, curing step, and a hard, inert coating layer which is covalently linked with the further coating is present after a second curing step, where the completion of the cure is delayed in time compared with the completion of the first cure.

The components of the coating in step a are applied either in as a pre-mixed mixture or as separate components. Alternatively the components are applied both a as a mixture comprising all or some of the compounds and as one or more separate components comprising the remaining ingredients.

The ratios r1, r2, and r3 are calculated as number ratios based on the compounds that fall under the general definitions of compounds in step a in claim 1. I.e. for r1 the number of thiol groups t in all compounds which fall under the compounds mentioned in claim 1 are counted, also the number of number of carbon-carbon double bonds cc (ene groups) in all compounds which fall under the compounds mentioned in claim 1 are counted. Then the ratio r1=t/cc is calculated. If for instance a compound containing only 1 thiol group is present it does not fall under compounds in claim 1 and is thus not counted.

When the ratio $r_1$ is in the interval $0.1 \leq r_1 \leq 0.9$ at least one homopolymerizing ene-compound is used in the coating. It is added together with the other ingredients of the primer coating. In one embodiment the at least one homopolymerizing ene-compound is selected from the group consisting of acrylate and methacrylate. An ene-compound comprises a carbon-carbon double bond.

In step b and c the reactions are initiated. This means that they are started, and the reactions can take a certain time to finish. When the both of the reactions initiated in step b and step c are finished more than 90% of the number of thiol groups have reacted, preferably more than 95%, more preferably more than 99%. Especially the reaction initiated in step c, is slower so that covalent bonds can be formed with the at least one further coating which is applied. In one embodiment the reaction in step c can be initiated and thereafter the coating can be applied. Then the reaction has not finished, but only proceeded to a limited extent when the further coating is applied, so that covalent bond with the further coating can be formed. Alternatively the further coating can be applied after step b and the second curing reaction can be initiated in step c after the further coating has been applied. The composition has a dual cure formulation composed of thiol-ene-epoxide.

The applied compounds in step a) will form a coating which can be called a primer, which binds the coating to the object to be coated and which also bind to the further coating which is applied on the primer.

In one embodiment, a wood surface is coated. An example of wood includes but is not limited to wood boards intended to be used on floors.

In one embodiment industrial application methods is used to apply the compounds in step a, including but not limited to methods such as spray coating, curtain coating or rolling, in a thin layer in one embodiment typically ranging between 2-100 microns (μm) thick. This refers to the compounds applied in step a and before any curing reactions are initiated. As mentioned the compounds can either be added in a mixture or separately.

In one embodiment the thiol is in stoichiometric excess compared with the ene and epoxide component respectively and stoichiometric overall with respect to thiol to ene plus epoxide. Ene refers to a carbon-carbon double bond. After application of the first layer, actinic radiation or moderated heat is used to initiate a radically mediated thiol-ene polymerization, and a partially polymerized semi-solid or solid polymer, with many reactive thiol and epoxide groups dispersed throughout the partially polymerized polymer, is formed. Depending on the process requirements, the second reaction is initiated simultaneously with the radically mediated polymerization, or initiated in a subsequent separate initialization event. In one embodiment the second reaction is anionically initiated with a pH above 7.

In one embodiment, after the first coating layer is applied and cured via radically mediated thiol-ene polymerization, a second layer, that may be of similar or the same composition as the first layer, or another composition reactive either with thiols, e.g. acrylate or methacrylate functional prepolymers, or epoxies, e.g. anhydride, thiol, isocyanate or amine functional prepolymers, is applied on top of the first coating. In one embodiment, after the second coating, typically actinic radiation or heat is applied to initiate a radically mediated cure of the second layer, whereupon covalent links are formed to the pendant thiol groups remaining in the first layer. In an alternative embodiment the second curing reaction is started at the same time as the first curing reaction or before the second layer is applied, however since the first curing reaction is faster than the second the first curing reaction will be completed first. In one embodiment the second curing reaction will be completed after the second layer is applied.

In a similar manner additional layers are in alternative embodiments added until the desired coating is produced.

Upon completion of the cure of the last layer, the second epoxide-thiol reaction, either initiated via heat or actinic radiation, is brought to completion to impart final mechanical and chemical properties and ensure covalent bonding via epoxide reactions with the hydroxyl groups present on wood components such as cellulose and thiol reactions to ene components present in wood resin components such as terpenes. As an alternative the second epoxide-thiol reaction is initiated with addition of a strong base and being at room temperature.

In one embodiment, metals are coated, using the method described above. The adhesion to the substrate, i.e. the surface of the object to be coated is provided by epoxide reaction with primarily metal hydrates present on most metal surfaces, or in an alternative embodiment via thiol links that covalently bond to gold, platinum etc.

In another embodiment, rubber substrates are coated, using the method described above. The adhesion to the substrate is provided by thiol reactions with double bonds present in for example natural rubber, polyisoprene etc.

In another embodiment, thermoplastic elastomers are coated, using the the method described above. The adhesion to the substrate is provided by thiol reactions with double bonds present in the rubbery segments of the thermoplastic elastomers.

In another embodiment, thermoplastic substrates are coated, using the method described above. The adhesion to the substrate is typically provided by epoxide reactions with the hydroxyl groups or active oxygen groups that result from plasma or corona treatment of thermoplastic surfaces.

In another embodiment, cellulose fiber based materials, e.g. paper, are coated and impregnated by the prepolymer formulations to form composite structures upon cure using the method described above. The adhesion to the fibers is typically provided by covalent bonding via epoxide reactions with the hydroxyl groups present on cellulose fibers.

In another typical embodiment, textile fiber based materials, e.g. woven materials, cloth etc., are coated and impregnated by the prepolymer formulations to form composite structures upon cure using the method described above. The adhesion to the fibers is typically provided by epoxide reactions with the hydroxyl or amine and amide groups present in many woven materials.

The embodiments described above can varied in terms of curing order, the use of two component prepolymer systems with various compositions of the two components, pre-treatment of the wood or metal, e.g. sanding of the wood etc. and etching of the metal etc. and corona treatment of plastics, room temperature conditions and other variations that are easily implemented to experts in the respective fields.

Eligible functional groups used to fabricate coating layers are those that participate in essentially alternating copolymerizations. In one embodiment monomers are multifunctional thiol monomers as the one component, an -ene (e.g. vinyl ether, norbornene and allyl ether) as the second component and epoxide as a third component. By off-stoichiometry formulation of the first, second and third components, i.e. the thiol component is in excess to the epoxide and ene respectively, surplus thiol and epoxide groups are present throughout the polymeric network upon completion of a first radically mediated thiol-ene polymerization process. Until completion of the second polymerization process, thiol and epoxide groups react within the coating layer, with adjacent coating layers and chemical moieties on the surface of the substrate, e.g. hydroxyl groups naturally present in both wood and metals such as aluminum, stainless steel, copper, gold etc. Alternatively, the thiol-epoxide polymerization process is completed first resulting in a partially cured material with a multitude of thiol and ene functional groups that are converted into a crosslinked material, with only a few ene, thiol and epoxide groups left, via a subsequent radically mediated reaction.

As an alternative the compound comprising at least two epoxide groups and the compound comprising at least two carbon-carbon double bonds is replaced by one compound comprising at least one epoxide group and at least one carbon-carbon double bond. In yet another alternative both a compound comprising at least one epoxide group and at least one carbon-carbon double bond and compounds comprising at least two carbon-carbon double bond and compounds comprising at least two epoxide groups are added together with the compound comprising at least two thiol groups.

In one embodiment, the invention provides wood and metal coatings composition with thiol-ene-epoxide liquid polymer precursors and suitable initiators where a first radically mediated polymerization provides a partially crosslinked polymer network with a multitude of thiol and epoxide groups present and a second anionically mediated polymerization provides a crosslinked network with very few remaining ene, thiol and epoxide groups.

In another embodiment, the coated substrate is a rubber that contains groups reactive to either of the functional groups present in the prepolymer formulation, e.g. thiol/ene/epoxide.

In yet another embodiment, the coated and/or impregnated substrate is composed largely of cellulose fibers.

In still another embodiment, the coated and/or impregnated substrate is composed largely of textile fibers.

In one embodiment the coatings composition comprises thiol-ene-epoxide liquid polymer precursors and suitable initiators, inhibitors, fillers and additives such as leveling agents, where a first radically mediated polymerization provides a partially crosslinked polymer network with a multitude of thiol and epoxide groups present and a second anionically mediated polymerization provides a crosslinked network with very few remaining ene, thiol and epoxide groups. In one embodiment a silane is used as additive.

In an alternative embodiment formulations are stoichiometric overall such that the number of thiol groups is essentially equal to the number of ene-groups plus the epoxide groups, e.g. 1/0.5/0.5 or 1/0.7/0.3 or 1/0.4/0.6 etc. with respect to the normalized to thiol number of thiol/ene/epoxide groups.

In one embodiment formulations are non-stoichiometric overall, e.g. 1/0.5/0.7 or 1/0.3/0.5 or 1/0.5/0.8 etc. with respect to the normalized to thiol number of thiol/ene/epoxide groups.

In one embodiment the initiators are of an alpha cleaving type for radically mediated polymerization, and of a thermally or photo-latent type base for the anionically mediated reaction.

In another embodiment the initiators are of an alpha cleaving type for radically mediated polymerization, and of a base type, e.g. DBN or other amine compounds for the anionically mediated reaction.

In yet another embodiment the initiators are of a hydrogen abstraction type for radically mediated polymerization, and of a base type, and of a thermally or photo-latent type base for the anionically mediated reaction.

In one embodiment, initiation of the anionically mediated reaction is performed by providing a reactive surface, e.g a silanized amine surface, or by applying a reactive solution or coating that contains chemical species capable of initiating anionically mediated polymerization.

Combinations of the above initiator types and methods are also useful in the invention.

In one embodiment, the coating comprises thiol-ene-epoxide liquid polymer precursors and suitable initiators, inhibitors, fillers and additives such as leveling agents, in a two component system, where a first component comprises thiol-ene monomers, an anionic initiator and a radical initiator and the second component comprises thiol-ene-epoxide monomers, where at least one of the polymerization reactions is initiated upon mixing of the two components.

In another embodiment, the coating comprising thiol-ene-epoxide liquid polymer precursors and suitable initiators, inhibitors, fillers and additives such as leveling agents is diluted with a suitable solvent to impart desired viscosity, e.g. for spray coating or curtain coating. Apart from the additional step of solvent removal, the use of the diluted formulation follows either of the previously described embodiments.

In one embodiment the reaction in step b) and/or step c) in claim 1 is initiated with an initiator. Examples of initiators that produce radicals include, but are not limited to, Rose Bengal (Aldrich), Darocur 2959 (2-hydroxy-1-[4-(hydroxyethoxy)phenyl]-2-methyl-1-propanone, D2959, Ciba-Geigy), Irgacure 651 (2,2-dimethoxy-2-phenylacetophenone, 1651, DMPA, Ciba-Geigy), Irgacure 184 (1-hydroxycyclohexyl phenyl ketone, 1184, Ciba-Geigy), Irgacure 907 (2-methyl-1-[4-(methylthio)phenyl]-2-(4-morpholinyl)-1-propanone, 1907, Ciba-Geigy), Camphorquinone (CQ, Aldrich), isopropyl thioxanthone (quantacure ITX, Great Lakes Fine Chemicals LTD., Cheshire, England), Kip 100 and 150 from Fratelli-Lamberti, Darocur 1173 2-Hydroxy-2-methyl-1-phenyl-propan-1-one (Ciba Specialty Chemicals), and phosphine oxides such as Irgacure Bis(2,4,6-trimethylbenzoyl)-phenylphosphineoxide 819 (Ciba). CQ is typically used in conjunction with an amine such as ethyl 4-N,N-dimethylaminobenzoate (4EDMAB, Aldrich) or triethanolamine (TEA, Aldrich) to initiate polymerization, for the anionic step a photolatent DBN from BASF is preferred. Photolatent DBN is typically used in conjunction with benzophenone or ITX.

Initiators for a thermally initiated or thermally accelerated cure include but are not limited to DBN, DMP-30 and tertiary amines. In one embodiment the elevated temperature treatment is about 70° C. during two hours. In one embodiment the radiation is used during 3-100 seconds. Radiation dose varies from 30 mJ/cm$^2$ to 1 J/cm$^2$.

The compounds used for the coating in one embodiment are i) a difunctional or multifunctional thiol monomers or mixtures of monomers with an average functionality ≥2 and ii) a difunctional or multifunctional -ene (e.g. vinyl ether, norbornene and allyl ether) or mixtures of -ene monomers with an average functionality ≥2, and iii) a difunctional or multifunctional epoxide monomers or mixtures of monomers with an average functionality ≥2. By off-stoichiometry formulation, i.e. either one component in excess, surplus reactive groups are present throughout the polymeric network upon completion of the first polymerization process. The compounds used for coating can be referred to as monomers since they are involved in a polymerization process. The formation of covalent bond between the compounds can be viewed as a polymerization process, since result will be a kind of cross linked network.

Optionally there are applied further substances, examples include but are not limited to fillers, additives, solvents, pigments, polymers, and oligomers.

The barrier properties of the coating are excellent and thus the coating can be used to form a barrier intended to be impermeable to liquid. Potential uses are within food packages for liquids, and other types of food. Thus in one embodiment the coating can form a barrier impermeable to liquid.

Other features and uses of the invention and their associated advantages will be evident to a person skilled in the art upon reading the description and the examples.

It is to be understood that this invention is not limited to the particular embodiments shown here. The following examples are provided for illustrative purposes and are not intended to limit the scope of the invention since the scope of the present invention is limited only by the appended claims and equivalents thereof.

EXAMPLES

Example 1—Adhesion Tests

Adhesion tests (according to ISO 2409) were performed to evaluate the adhesion of the primer on different substrate materials. Three different formulations of thiol-ene-epoxy were used based on 1,3,5-Triallyl-1,3,5-triazine-2,4,6(1H,3H,5H)-trione (TATATO), KarentzMT™ PE1, Pentaerythritol tetrakis(3-mercaptobutylate) (PTMB) from ShowaDenko, Japan, Epoxy Novolac D.E.N. 431 (DEN) from Enorica GmbH with epoxy equivalent weight: 172-179, epoxide percentage %: 24-25. One formulation thiol-methacrylate-epoxy, based on 1,4-Butanedioldimethacrylate was also tested.

In formulation 1 and 2 the ratio between thiol and allyl was r1=1.8, and between epoxy and thiol r2=0.4. In formulation 3 the functional ration between thiol and allyl was r1=1.8 and between epoxy and thiol r2=0.67. In formulation 4 the ration between thiol and metacrylate was r1=0.4 and between epoxy and thiol r2=2.25. As initiators were added 2 w % Lucirin™ TPO-L (BASF, Germany), 4 w % Benzophenone and 2 w % of a photo-latent version of 1,5-diazabicyclo[4.3.0]-non-5-ene (PL-DBN) from BASF, Switzerland. In formulation 2 also 0.5 w % of 3-Trimethoxysilylpropyl methacrylate (Z-6030 from Dow Corning) was added.

To ensure a correct adhesion measure also during the curing process, a thin layer of fast-curing acrylate based coating (UL1117, Becker-Acroma, Märsta, Sweden) was applied on top of our primer coatings to give an invariant adhesion layer for the tape.

Before application of the primer, the wood sample panels were brushed clean from any loose particles, the plastic sample panels where washed with soap and the metals were cleaned with toluene.

The thiol-ene-epoxy and thiol-methacrylate-epoxy formulations were applied on the substrates with a frame applicator with 10 μm gap and subsequently cured under UV light (Mercury Lamp) until solid. Thereafter the middle coat consisting of UL1117 was applied with an applicator with 20 μm spacing and cured under UV light (Mercury lamp) until tested hard and non-sticky.

The cross-hatch adhesion tests were performed according to the ISO standard 2409. Briefly, the test substrates were placed on a flat and rigid substrate and the cutting tool (6 blades, 1 mm apart) was used to cut two perpendicular cuts. The surface was brushed with a light brush and the tape (Scotch®, 600p) was applied on the cross-hatch and was gently rubbed to ensure full contact. The tape was then pulled off at approximately 60 deg angle during approximately 0.5 seconds. The resulting surfaces were inspected under microscope and graded from 0 to 5 according to the ISO 2409 standard. The results are presented in Table 1.

TABLE 1

Sample material substrates and the adhesion according to ISO 2409 2 h and 12 h respectively after application of the primer and a middle coating. (0 = excellent to 5 = no or very poor adhesion).

| Sample material | Pre treatment | Primer formulation (10 μm) | Middle coat (20 μm) | Adhesion, 2 h | Adhesion, 12 h |
|---|---|---|---|---|---|
| Wood | | | | | |
| Oak | none | Form 1 | UL1117 | 0 | 0 |
| Oak | none | Form 3 | UL1117 | 1 | 0 |
| Oak | none | Form 4 | UL1117 | 4 | 2 |
| Pine | none | Form 1 | UL1117 | 1 | 0 |
| Stained pine | none | Form 1 | UL1117 | 1 | 0 |
| Plastics | | | | | |
| Polyurethane (PUR) | none | Form 1 | UL1117 | 0 | 0 |
| Nitrilrubber (NBR) | none | Form 1 | UL1117 | 0 | 0 |
| ABS | none | Form 4 | UL1117 | 1 | 0 |
| Metals | | | | | |
| Aluminum | Toluene | Form 2 | UL1117 | 1 | 0 |
| Aluminum | Toluene | Form 3 | UL1117 | 2 | 1 |
| Aluminum | Toluene | Form 4 | UL1117 | | 0 |
| Cupper | Toluene | Form 2 | UL1117 | 1 | 0 |
| Stainless steel | Toluene | Form 2 | UL1117 | 0 | 0 |
| Stainless steel | Toluene | Form 1 | UL1117 | 1 | 0 |
| Silicon wafer (polished) | — | Form 2 | UL1117 | 0 | 0 |
| Silicon wafer (polished) | — | Form 2 | UL1117 | 0 | 0 |
| Glass | — | No 1 | UL1117 | 1 | 0 |

Example 2—Glass Transition Temperature and Mechanical Data

The glass transition temperature and storage modulus were analyzed using Dynamic Mechanical Analysis (DMA, Q800, PerkinElmer, Waltham, USA) for different compositions of 1,3,5-Triallyl-1,3,5-triazine-2,4,6(1H,3H,5H)-trione (TATATO), Pentaerythitol tetrakis(2-mercaptoacetate) (PETMP) and Epoxy Novolac D.E.N. 431. The initiator used where 1% Lucirin™ TPO-L and 1% of a photolatent DBN (BASF, Switzerland).

The films were first polymerized using UV light but using a filter blocking all wavelengths under 400 nm. This initiated only the first radical curing mechanism forming a solid polymer film. At a later point, these polymer films were irradiated by an unfiltered UV-light from a Mercury lamp initiating the anionic curing mechanism. Table 2 shows data from DMA analysis taken after first cure (Formulation 5, 6, 7) and table 3 after the second cure (Formulation 5, 6, 7, 8, 9). Note the narrow glass transition that occurs during a very narrow temperature interval, here the half height peak width of the tan δ curve is displayed.

TABLE 2

DMA data for three different formulations after first cure.

| Formulation | Formulation | Tg (° C.) | ΔT of glass transition at half height peak width of tan δ curve | E-modulus at 25° C. | E-modulus at 100° C. |
|---|---|---|---|---|---|
| 5 | r1 = 1.25, r2 = 0.2 | 23 ± 0.4 | 20 ± 3 | 34 ± 5 | 3 ± 0.2 |
| 6 | r1 = 1.5, r2 = 0.3 | 11 ± 2 | 13 ± 5 | 3.5 ± 0.6 | 1.5 ± 0 |
| 7 | r1 = 1.5, r2 = 0.4 | <0 | Not meas. | 1 ± 0.2 | 0.5 ± 0 |

TABLE 3

DMA data for three different formulations after second cure.

| Formulation | Formulation | Tg (° C.) | ΔT of glass transition at half height peak width of tan δ curve | E-modulus at 25° C. | E-modulus at 100° C. |
|---|---|---|---|---|---|
| 5 | r1 = 1.25, r2 = 0.2 | 86 ± 0.4 | 17 ± 2 | 1780 ± 50 | 17.8 ± 0.3 |
| 6 | r1 = 1.5, r2 = 0.3 | 87 ± 0.9 | 19 ± 3 | 1830 ± 200 | 18 ± 0.5 |
| 7 | r1 = 1.5, r2 = 0.4 | 87 ± 3.4 | 21 ± 2 | 2460 ± 450 | 17 ± 1 |
| 8 | r1 = 1.25, r2 = 0.3 | 83 ± 3.2 | 21 ± 2 | 2300 ± 300 | 16 ± 0.4 |
| 9 | r1 = 1.25, r2 = 0.4 | 81 ± 4.1 | 25 ± 2 | 2400 ± 200 | 17 ± 0.6 |

Example 3—FT-IR Analysis of the Curing Mechanism

The polymerization was monitored using FT-IR transmission. The formulation used was same as formulation 5 in example 2. A thin film of the prepolymer was squeezed between two NaCl crystals, irradiated with unfiltered UV to initiate both curing mechanisms at the same time. The thiol peak (2575 cm$^{-1}$) and allyl peak (1644 cm$^{-1}$) were monitored during polymerization. Table 4 shows the area under each peak before polymerization (prepolymer), after 60 s and 180 s of UV irradiation and after >24 h in 75° C. The allyl peak disappears during the first curing reaction and the thiol peak reduce in magnitude as part of the thiols are reacted with the allyl monomers, but due to the off-stoichiometry a large number of thiols are left unreacted. Over time these react with the epoxy groups and disappeared after 12 h at room temperature demonstrating the rapid thiol-ene reaction and the slower thiol-epoxy reaction.

TABLE 4

Relative area (directly proportional to the respective concentration of functional groups) under the thiol and allyl peaks during curing compared to the prepolymer.

| | Prepolymer | 60 s UV | 180 s UV | >12 h at 25° C. |
|---|---|---|---|---|
| Thiol peak | 1 | 0.45 | 0.4 | 0 |
| Allyl Peak | 1 | 0.25 | 0 | 0 |

Example 4—Latent Curing

In another example formulations based on TATATO, PTMP and BADGE (Bisphenol A diglycidyl ether, Sigma-Aldrich Chemie GmbH) with 1% TPO-L (BASF, Germany) and 1% photo-latent DBN, PL-DBN (BASF, Switzerland). The molar functional ratio was r1=1.4 and r2=0.3 (Formulation 10)

The dual curing process is carried out through two separated UV curing steps. The TPO-L photo initiator triggers the thiol-ene reaction at wavelengths above 400 nm in the first step, the photolatent curing agent initiates the thiol-epoxy reaction through the second curing step at wavelengths below 400 nm. In the first curing step light from a standard Hg lamp is filtered to block light below 400 nm. In the second curing step the Hg lamp is unfiltered.

The resulting material showed elastomeric and adhesive properties after the first curing step and was stiff and hard after the second curing process. The material that had undergone the first UV filtered UV exposure retained the same elastomeric mechanical property over time (up to a month) but hardened rapidly when exposed to unfiltered UV, demonstrating the fact that the curing processes could be successfully separated.

TABLE 5

Summary of experiment 4

| Pre-polymer | r1 = 1.4, r2 = 0.3, 1 w % TPO-L, 1 w % PL-DBN | |
| --- | --- | --- |
| Curing order | Curing step 1 | Curing step 2 |
| UV source | Mercury lamp with filter blocking wavelengths <400 nm | Unfiltered Mercury lamp |
| Stiffness | E-modulus <10 MPa, somewhat sticky | E-modulus >1000 MPa, dry |
| Transparent | Yes | Yes |
| Shelf-life | Up to 1 week without affecting mechanical properties and still curable with a second curing step to a stiff polymer. | Stable, all monomers reacted. Very little leachable components in chloroform <1%. |

Example 5—Wafer Bonding

Wafer bonding (Ref: F. Forsberg et al, Proc. of MEMS 2013, pp. 343-346) was demonstrated using a formulation composed of TATATO, PTMP and DEN at r1=1.8 and r2=0.4 with 0.5 w % TPO-L and 0.1 w % DMP-30 (2,4,6-(dimethylaminomethyl)phenol) from Polysciences Inc. (Formulation 11)

The prepolymer was spun coated on a wafer at 6000 rpm. Formulation 11 was in once case also diluted 1:1 in toluene before spinning and thereafter dried in vacuum at room temperature for 10 min. The films were subsequently exposed to unfiltered UV light from a Hg source (400 mJ/cm$^2$ measured at 365 nm). This created a solid but a little sticky layer with unreacted thiol and epoxy groups. A SUSS Microtec SB8 wafer bonder was used to bond the coated wafer and a lid silicon wafer. The bonding processes started with pumping a vacuum (lower than 10$^{-4}$ mbar) in the bond chamber, applying a bond force, pressing the wafers together, and ramp the temperature to 90° C. The wafers were bonded with a 5000 N bond force together with a thermal curing time of 1 hour at 90° C.

Adhesion energy was evaluated by bonding two silicon wafers, with one having etched circular through holes. After bonding chips were diced out and the holes were connected to a nitrogen pressure source, which were ramped until the lid delaminated. The pressure at the start of delamination (burst pressure) was converted into bond energy γ using:

$$p_{cr} = \left(\frac{32}{3(1-v^2)}\right)\left(\frac{h}{a}\right)^{3\frac{1}{2}}\left(\frac{E\gamma_a}{a}\right)^{\frac{1}{2}}$$

Where h is the wafer thickness, a is the diameter of the circular orifice (here 12 mm), v is the Poisson ratio for Si (0.172, average between <100> and <110>), E is the Young's modulus for Si (180 GPa) and $\gamma_a$ is the adhesive fracture energy per square meter. All experiments used Si lid wafers with a thickness of between 125 μm and 132 μm. The bond energies for wafers bonded using BCB (Cyclotene 3022-46, Dow Chemical Company) and the nano imprint resist mr-I 9150 XP (Micro resist technology GmbH, Germany) were also measured using the same setup and bonding using the described bonding procedure in respective data sheets (thermal baking >200° C.). The results are presented in table 6.

TABLE 6

Adhesion energy between two Si wafers (4") adhesively bonded using different polymers.

| Bonding layer | Adhesion promoter | Lid Si wafer thickness (μm) | Bond layer thickness (μm) | Number of samples | Mean bond energy, γ (J/m$^2$) | Standard deviation (J/m$^2$) |
| --- | --- | --- | --- | --- | --- | --- |
| BCB | AP3000 adhesion promoter (Dow chemical company) spun at 5000 rpm on the lid wafer | 125 | 2.4 | 10 | 35 | 7.6 |
| BCB | No | 306 | 2.4 | 11 | 5.7 | 0.4 |
| mr-I 9150XP | No | 302 | 1.5 | 10 | 2.4 | 0.5 |
| mr-I 9150XP | No | 303 | 2.3 | 8 | 1.7 | 0.8 |
| Formulation 11 | No | 302 | Not measured > 3 μm | 11 | 20 | 6.8 |
| Formulation 11 diluted 1:1 in toluene before spinning | No | 132 | 3.9 | 11 | 2.2 | 2.0 |

The results from table 6 demonstrates the disclosed formulations could be suitable as wafer bonding adhesive at processes requiring low temperatures. Moreover they are easily etched using oxygen plasma enabling use as temporary wafer bond.

Example 6—UV-Vis and IR

The formulations were also tested for transparency in the UV-vis and IR regions after complete cure. In the UV-vis only the initiators are absorbing under 400 nm. Between 400 nm to 900 nm, the absorption is similar or close to that of COC (cylic olefin copolymers) or COP (cyclic olefin polymers).

| Formulation | UV-vis characteristics | IR characteristics |
| --- | --- | --- |
| TATATO, PTMP, DEN r1 = 1.1 and r2 = 0.4 with 1 w % TPO-L and 1 w % photo-latent DBN | [300 nm, 400 nm]: high absorption<br>[400 nm, 900 nm]: >95% | [900 nm, 2000 nm]: >95% transparency<br>Broad peak around 2500 nm |

-continued

| Formulation | UV-vis characteristics | IR characteristics |
|---|---|---|
| (Formulation 12) | transparency | (hydroxyl groups) |
| COC | [300, 900 nm]: >95% transparency | |
| COP | [300 nm, 900 nm]: >97% transparency | |

Example 7—Barrier Properties 10 fresh pine substrates with knots were coated with Formulation 1 using a 20 micrometer frame applicator and cured with two passes in a UV-oven with normal Hg-lamps (approx. 200 mJ/cm$^2$). After about thirty minutes, a waterborne conventional outdoor coating with white pigmentation was applied at 150 g/m$^2$ via spray coating in order to get a white reference surface. The panels were dried for 45 minutes in a constant heat oven (standard Sherwin-Williams protocols were used).

The samples were 1 week later subjected to 24 and 72 hrs of QUV light (accelerated weathering tester). Below is a summary of the comparison between Formulation 1 and a commercial water borne primer (1422 ED 9003) from Sherwin-Williams with the same white pigmentation coating applied on top. Experienced professionals assessed the yellowing on a scale from 10 to 1 where 10 is the least yellowing (best).

| | 24 h average | 24 h Person 1 | 24 h Person 2 | 24 h Person 3 | 72 h average | 72 h Person 1 | 72 h Person 2 | 72 h Person 3 | 72 h Person 4 |
|---|---|---|---|---|---|---|---|---|---|
| Formulation 1 | 8.0 | 7.9 | 8.8 | 7.8 | 8.9 | 9.2 | 9.6 | 8.3 | 8.4 |
| Commercial primer | 8.4 | 9 | 8.3 | 7.9 | 8.1 | 8.0 | 8.4 | 7.5 | 8.6 |

In terms of yellowing, i.e. barrier properties, Formulation 1 clearly performs at the same level as the currently used commercial primer.

We claim:

1. A method for at least partially coating an object, said method comprising the steps:
    a) applying at least partially to said object at least one of:
        i. a compound comprising at least two thiol groups,
        ii. a compound comprising at least two carbon-carbon double bonds, and
        iii. a compound comprising at least two epoxide groups, and
        wherein ratio ($r_1$=t/cc) of the total number of thiol groups (t) in all of the above compounds and the total number of carbon-carbon double bonds (cc) in all of the above compounds is selected from the group consisting of $0.1 \le r_1 \le 0.9$ and $1.1 \le r_1 \le 20$,
        with the proviso that if the ratio $r_1$ is in the interval: $0.1 \le r_1 \le 0.9$, then at least one homopolymerizing ene-compound is used,
        wherein ratio ($r_2$=t/e) of the total number of thiol groups (t) in all of the above compounds and the total number of epoxide groups (e) in all of the above compounds is in the range $0.3 \le r_2 \le 20$,
    b) initiating a reaction of at least a part of the applied compound comprising at least two thiol groups with at least one of:
        i. at least a part of the applied compound comprising at least two carbon-carbon double bonds and,
        ii. at least a part of the applied compound comprising at least two epoxide groups,
        iii. at least a part of the applied compound comprising at least one carbon-carbon double bond and at least one epoxide group,
        to obtain an intermediate at least partial coating, wherein said coating comprises at least one compound comprising an unreacted group selected from the group consisting of an unreacted thiol group, and an unreacted epoxide group,
    c) initiating a reaction of at least a part of said at least one compound comprising an unreacted group,
        wherein at least one further coating is applied after step b) and before step c), to obtain to a final coated article.

2. The method according to claim 1, wherein the reaction between at least a part of the applied compound comprising at least two thiol groups and at least a part of the applied compound comprising at least one or two carbon-carbon double bonds is initiated with at least one selected from the group consisting of actinic radiation, and elevated temperature.

3. The method according to claim 1, wherein the reaction of the at least one compound comprising an unreacted group selected from the group consisting of an unreacted thiol group and an unreacted epoxide group is initiated with at least one selected from the group consisting of actinic radiation, and elevated temperature.

4. The method according to claim 1, wherein the reaction of the at least one compound comprising an unreacted group selected from the group consisting of an unreacted thiol group and an unreacted epoxide group is mediated with a basic compound.

5. The method according to claim 1, wherein step b) and c) are initiated simultaneously.

6. The method according to claim 1, wherein said at least one further coating comprises at least one compound selected from the group consisting of a compound reactive with a thiol forming a covalent bond and a compound reactive with an epoxide to form a covalent bond.

7. The method according to claim 1, wherein said at least one further coating comprises at least one compound comprising at least one chemical group selected from the group consisting of a hydroxyl group, an amine group, a thiol group, an anhydride group, a cyanoacrylate group, an epoxide group, and a metal oxide.

8. The method according to claim 1, wherein said at least one further coating comprises at least one compound comprising a chemical group selected from the group consisting of an acrylate, a methacrylate, a thiol, an isocyanate, a maleate, a fumarate, a vinyl ether, an alkene, an alkyne, an allyl ether.

9. The method according to claim 1, wherein said at least one further coating comprises at least one selected from the group consisting of a metal, a polymer sheet, and a powder.

10. The method according to claim 1, wherein the surface of said object to be at least partially coated comprises at least one selected from the group consisting of a metal, a rubber, silicon, a thermoplastic elastomer, cellulose fibers, a textile, wood, a composite material, concrete, and stone.

11. The method according to claim 1, wherein the object to be at least partially coated is a printed circuit board.

12. The method according to claim 1, wherein said compound comprising at least two thiol groups is selected from the group consisting of pentaerythritol tetrakis(2-mercaptoacetate), pentaerythritol tetramercaptopropionate (PETMP); 1-octanethiol; butyl 3-mercaptopropionate; 2,4,6-trioxo-1,3,5-triazina-triy (triethyl-tris(3-mercapto propionate); 1,6-Hexanedithiol; 2,5-dimercaptomethyl-1,4-dithiane, pentaerythritol tetramercaptoacetate, trimethylolpropane trimercaptoacetate, 2,3-dimercapto-1-propanol, 2,3-(dimercaptoethylthio)-1-mercaptopropane, 1,2,3-trimercaptopropane, toluenedithiol, xylylenedithiol, 1,8-octanedithiol, and trimethylolpropane tris(3-mercaptopropionate), and glycol dimercaptopropionate and pentaerythritol tetramercaptopropionate (PETMP).

13. The method according to claim 1, wherein said compound comprising at least two carbon-carbon double bonds is selected from the group consisting of triallyl-1,3,5-triazine-2,4,6(1H,3H,5H)-trione; triethyleneglycol divinyl ether (TEGDVE); trimethylolpropane diallyl ether; 1,6-heptadiyne; 1,7-octadiyne; bis-2,2-[4-(2-[norborn-2-ene-5-carboxylate]ethoxy)phenyl]propane (BPAEDN); 1,6-hexanediol di-(endo,exo-norborn-2-ene-5-carboxylate) (HDDN); trimethylolpropane tri-(norborn-2-ene-5-carboxylate) (TMPTN); pentaerythritoltri-(norborn-2-ene-5-carboxylate) (PTN3); pentaerythritol tetra-(norborn-2-ene-5-carboxylate) (PTN4); tricyclodecane dimethanol di-(endo, exo-norborn-2-ene-5-carboxylate) (TCDMDN); and di(trimethylolpropane) tetra-(norborn-2-ene-5-carboxylate) (DTMPTN).

14. The method according to claim 1, wherein said compound comprising at least two epoxide groups is selected from the group consisting of Tris(2,3-epoxidepropyl) isocyanurate, trimethylolpropane triglycidyl ether, tris (4-hydroxyphenyl)methane triglycidyl ether, poly(ethylene glycol) diglycidyl ether, bisphenol A diglycidyl ether 1,2,5,6-diepoxidecyclooctane, 1,2,7,8-diepoxideoctane, 1,2-Epoxide-5-hexene, 1,4-cyclohexanedimethanol diglycidyl ether, 3,4-epoxidecyclohexylmethyl 3,4-epoxidecyclohexanecarboxylate, 4,4'-methylenebis(N,N-diglycidylaniline), bis[4-(glycidyloxy)phenyl]methane, bis[4-(glycidyloxy)phenyl]methane, diglycidyl 1,2-cyclohexanedicarboxylate, N,N-diglycidyl-4-glycidyloxyaniline, neopentyl glycol diglycidyl ether, resorcinol diglycidyl ether, and tris(4-hydroxyphenyl)methane triglycidyl ether.

15. The method according to claim 1, wherein said compound comprising at least two epoxide groups is allylglycidylether.

16. The method according to claim 1, wherein the thickness of the compounds added in step a) is in the interval 2-100 μm.

17. The method according to claim 1, wherein said at least one homopolymerizing ene-compound is selected from the group consisting of acrylate and methacrylate.

* * * * *